(12) United States Patent
Peters et al.

(10) Patent No.: US 7,626,379 B2
(45) Date of Patent: *Dec. 1, 2009

(54) PROBE STATION HAVING MULTIPLE ENCLOSURES

(75) Inventors: Ron A. Peters, Tigard, OR (US);
Leonard A. Hayden, Beaverton, OR (US); Jeffrey A. Hawkins, Portland, OR (US); R. Mark Dougherty, Aloha, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/977,338

(22) Filed: Oct. 24, 2007

(65) Prior Publication Data

US 2008/0048693 A1 Feb. 28, 2008

Related U.S. Application Data

(63) Continuation of application No. 11/820,519, filed on Jun. 20, 2007, now Pat. No. 7,436,170, which is a continuation of application No. 11/450,099, filed on Jun. 9, 2006, now Pat. No. 7,250,752, which is a continuation of application No. 10/980,083, filed on Nov. 3, 2004, now Pat. No. 7,190,181, which is a continuation of application No. 10/615,724, filed on Jul. 8, 2003, now Pat. No. 6,842,024, which is a continuation of application No. 10/273,787, filed on Oct. 17, 2002, now Pat. No. 6,639,415, which is a continuation of application No. 10/013,185, filed on Dec. 7, 2001, now Pat. No. 6,489,789, which is a continuation of application No. 09/908,218, filed on Jul. 17, 2001, now Pat. No. 6,362,636, which is a continuation of application No. 09/451,698, filed on Nov. 30, 1999, now Pat. No. 6,288,557, which is a continuation of application No. 08/870,335, filed on Jun. 6, 1997, now Pat. No. 6,002,263.

(51) Int. Cl.
*G01R 31/28* (2006.01)
(52) U.S. Cl. ................................. 324/158.1
(58) Field of Classification Search ............. 324/158.1, 324/765, 760, 754, 761–762; 438/14–18; 257/48
See application file for complete search history.

(56) References Cited

U.S. PATENT DOCUMENTS 1,191,486 A   7/1916   Tyler (Continued)

FOREIGN PATENT DOCUMENTS

CN   1083975      3/1994
DE   29 12 826    10/1980

OTHER PUBLICATIONS

L.L. Sohn, O.A.Saleh, G.R. Facer, A.J. Beavis, R.S. Allan, and D.A. Notterman, "Capacitance cytometry: Measuring biological cells one by one," PNAS Sep. 26, 2000, vol. 97 No. 20 pp. 10687-10690, www.pnas.org.

(Continued)

*Primary Examiner*—Ha Tran T Nguyen
*Assistant Examiner*—Tung X Nguyen
(74) *Attorney, Agent, or Firm*—Chernoff, Vilhauer, McClung & Stenzel

(57) ABSTRACT

A probe station for probing a test device has a chuck element for supporting the test device. An electrically conductive outer shield enclosure at least partially encloses such chuck element to provide EMI shielding therefor. An electrically conductive inner shield enclosure is interposed between and insulated from the outer shield enclosure and the chuck element, and at least partially encloses the chuck element.

15 Claims, 3 Drawing Sheets

U.S. PATENT DOCUMENTS

| | | |
|---|---|---|
| 1,337,866 A | 4/1920 | Whitacker |
| 2,106,003 A | 1/1938 | Hewitt |
| 2,142,625 A | 1/1939 | Zoethout |
| 2,197,081 A | 4/1940 | Piron |
| 2,264,685 A | 12/1941 | Wells |
| 2,376,101 A | 5/1945 | Tyzzer |
| 2,389,668 A | 11/1945 | Johnson |
| 2,471,897 A | 5/1949 | Rappi |
| 2,812,502 A | 11/1957 | Doherty |
| 3,176,091 A | 3/1965 | Hanson et al. |
| 3,185,927 A | 5/1965 | Margulis et al. |
| 3,192,844 A | 7/1965 | Szasz et al. |
| 3,193,712 A | 7/1965 | Harris |
| 3,201,721 A | 8/1965 | Voelcker |
| 3,230,299 A | 1/1966 | Radziekowski |
| 3,256,484 A | 6/1966 | Terry |
| 3,265,969 A | 8/1966 | Catu |
| 3,289,046 A | 11/1966 | Carr |
| 3,333,274 A | 7/1967 | Forcier |
| 3,359,014 A | 12/1967 | Clements |
| 3,405,361 A | 10/1968 | Kattner et al. |
| 3,408,565 A | 10/1968 | Frick et al. |
| 3,435,185 A | 3/1969 | Gerard |
| 3,484,679 A | 12/1969 | Hodgson et al. |
| 3,596,228 A | 7/1971 | Reed, Jr. et al. |
| 3,602,845 A | 8/1971 | Agrios et al. |
| 3,609,539 A | 9/1971 | Gunthert |
| 3,642,415 A | 2/1972 | Johnson |
| 3,648,169 A | 3/1972 | Wiesler |
| 3,654,573 A | 4/1972 | Graham |
| 3,662,318 A | 5/1972 | Decuyper |
| 3,666,296 A | 5/1972 | Fischetti |
| 3,700,998 A | 10/1972 | Lee et al. |
| 3,710,251 A | 1/1973 | Hagge et al. |
| 3,714,572 A | 1/1973 | Ham et al. |
| 3,740,900 A | 6/1973 | Youmans et al. |
| 3,775,644 A | 11/1973 | Cotner et al. |
| 3,777,260 A | 12/1973 | Davies et al. |
| 3,810,017 A | 5/1974 | Wiesler et al. |
| 3,814,838 A | 6/1974 | Shafer |
| 3,814,888 A | 6/1974 | Bowers et al. |
| 3,829,076 A | 8/1974 | Sofy |
| 3,836,751 A | 9/1974 | Anderson |
| 3,858,212 A | 12/1974 | Tompkins et al. |
| 3,863,181 A | 1/1975 | Glance et al. |
| 3,866,093 A | 2/1975 | Kusters et al. |
| 3,930,809 A | 1/1976 | Evans |
| 3,936,743 A | 2/1976 | Roch |
| 3,952,156 A | 4/1976 | Lahr |
| 3,970,934 A | 7/1976 | Aksu |
| 3,976,959 A | 8/1976 | Gaspari |
| 3,992,073 A | 11/1976 | Buchoff et al. |
| 3,996,517 A | 12/1976 | Fergason et al. |
| 4,001,685 A | 1/1977 | Roch |
| 4,008,900 A | 2/1977 | Khoshaba |
| 4,009,456 A | 2/1977 | Hopfer |
| 4,027,253 A | 5/1977 | Chiron et al. |
| 4,035,723 A | 7/1977 | Kvaternik |
| 4,038,894 A | 8/1977 | Knibbe et al. |
| 4,042,119 A | 8/1977 | Hassan et al. |
| 4,049,252 A | 9/1977 | Bell |
| 4,066,943 A | 1/1978 | Roch |
| 4,072,576 A | 2/1978 | Arwin et al. |
| 4,093,988 A | 6/1978 | Scott |
| 4,099,120 A | 7/1978 | Aksu |
| 4,115,735 A | 9/1978 | Stanford |
| 4,115,736 A | 9/1978 | Tracy |
| 4,116,523 A | 9/1978 | Coberly et al. |
| 4,135,131 A | 1/1979 | Larsen et al. |
| 4,151,465 A | 4/1979 | Lenz |
| 4,161,692 A | 7/1979 | Tarzwell |
| 4,172,993 A | 10/1979 | Leach |
| 4,186,338 A | 1/1980 | Fichtenbaum |
| 4,275,446 A | 6/1981 | Blaess |
| 4,277,741 A | 7/1981 | Faxvog et al. |
| 4,280,112 A | 7/1981 | Eisenhart |
| 4,284,033 A | 8/1981 | del Rio |
| 4,284,682 A | 8/1981 | Tshirch et al. |
| 4,287,473 A | 9/1981 | Sawyer |
| 4,327,180 A | 4/1982 | Chen |
| 4,330,783 A | 5/1982 | Toia |
| 4,342,958 A | 8/1982 | Russell |
| 4,346,355 A | 8/1982 | Tsukii |
| 4,352,061 A | 9/1982 | Matrone |
| 4,357,575 A | 11/1982 | Uren et al. |
| 4,365,109 A | 12/1982 | O'Loughlin |
| 4,365,195 A | 12/1982 | Stegens |
| 4,371,742 A | 2/1983 | Manly |
| 4,376,920 A | 3/1983 | Smith |
| 4,383,178 A | 5/1983 | Shibata et al. |
| 4,383,217 A | 5/1983 | Shiell |
| 4,401,945 A | 8/1983 | Juengel |
| 4,414,638 A | 11/1983 | Talambrias |
| 4,419,626 A | 12/1983 | Cedrone et al. |
| 4,425,395 A | 1/1984 | Negishi et al. |
| 4,426,619 A | 1/1984 | Demand |
| 4,431,967 A | 2/1984 | Nishioka |
| 4,453,142 A | 6/1984 | Murphy |
| 4,468,629 A | 8/1984 | Choma, Jr. |
| 4,473,798 A | 9/1984 | Cedrone et al. |
| 4,479,690 A | 10/1984 | Inouye et al. |
| 4,480,223 A | 10/1984 | Aigo |
| 4,487,996 A | 12/1984 | Rabinowitz et al. |
| 4,491,173 A | 1/1985 | Demand |
| 4,503,335 A | 3/1985 | Takahashi |
| 4,507,602 A | 3/1985 | Aguirre |
| 4,515,133 A | 5/1985 | Roman |
| 4,515,439 A | 5/1985 | Esswein |
| 4,528,504 A | 7/1985 | Thornton, Jr. et al. |
| 4,531,474 A | 7/1985 | Inuta |
| 4,532,423 A | 7/1985 | Tojo et al. |
| 4,552,033 A | 11/1985 | Marzhauser |
| 4,557,599 A | 12/1985 | Zimring |
| 4,566,184 A | 1/1986 | Higgins et al. |
| 4,567,321 A | 1/1986 | Harayama |
| 4,567,908 A | 2/1986 | Bolsterli |
| 4,575,676 A | 3/1986 | Palkuti |
| 4,588,950 A | 5/1986 | Henley |
| 4,588,970 A | 5/1986 | Donecker et al. |
| 4,621,169 A | 11/1986 | Petinelli et al. |
| 4,626,618 A | 12/1986 | Takaoka et al. |
| 4,641,659 A | 2/1987 | Sepponen |
| 4,642,417 A | 2/1987 | Ruthrof et al. |
| 4,646,005 A | 2/1987 | Ryan |
| 4,651,115 A | 3/1987 | Wu |
| 4,665,360 A | 5/1987 | Phillips |
| 4,673,839 A | 6/1987 | Veenendaal |
| 4,675,600 A | 6/1987 | Gergin |
| 4,680,538 A | 7/1987 | Dalman et al. |
| 4,684,783 A | 8/1987 | Gore |
| 4,684,883 A | 8/1987 | Ackerman et al. |
| 4,691,163 A | 9/1987 | Blass et al. |
| 4,691,831 A | 9/1987 | Suzuki et al. |
| 4,694,245 A | 9/1987 | Frommes |
| 4,695,794 A | 9/1987 | Bargett et al. |
| 4,697,143 A | 9/1987 | Lockwood et al. |
| 4,703,433 A | 10/1987 | Sharrit |
| 4,705,447 A | 11/1987 | Smith |
| 4,709,141 A | 11/1987 | Olsen et al. |
| 4,711,563 A | 12/1987 | Lass |
| 4,712,370 A | 12/1987 | MacGee |
| 4,713,347 A | 12/1987 | Mitchell et al. |
| 4,725,793 A | 2/1988 | Igarashi |
| 4,727,637 A | 3/1988 | Buckwitz et al. |

| | | | | | |
|---|---|---|---|---|---|
| 4,730,158 A | 3/1988 | Kasai et al. | 5,006,796 A | 4/1991 | Burton et al. |
| 4,731,577 A | 3/1988 | Logan | 5,010,296 A | 4/1991 | Okada et al. |
| 4,734,872 A | 3/1988 | Eager et al. | 5,019,692 A | 5/1991 | Nbedi et al. |
| 4,739,259 A | 4/1988 | Hadwin et al. | 5,030,907 A | 7/1991 | Yih et al. |
| 4,742,571 A | 5/1988 | Letron | 5,034,688 A | 7/1991 | Moulene et al. |
| 4,744,041 A | 5/1988 | Strunk et al. | 5,041,782 A | 8/1991 | Marzan |
| 4,746,857 A | 5/1988 | Sakai et al. | 5,045,781 A | 9/1991 | Gleason et al. |
| 4,754,239 A | 6/1988 | Sedivec | 5,061,823 A | 10/1991 | Carroll |
| 4,755,746 A | 7/1988 | Mallory et al. | 5,065,089 A | 11/1991 | Rich |
| 4,755,747 A | 7/1988 | Sato | 5,065,092 A | 11/1991 | Sigler |
| 4,755,874 A | 7/1988 | Esrig et al. | 5,066,357 A | 11/1991 | Smyth, Jr. et al. |
| 4,757,255 A | 7/1988 | Margozzi | 5,070,297 A | 12/1991 | Kwon et al. |
| 4,758,785 A | 7/1988 | Rath | 5,077,523 A | 12/1991 | Blanz |
| 4,759,712 A | 7/1988 | Demand | 5,082,627 A | 1/1992 | Stanbro |
| 4,766,384 A | 8/1988 | Kleinberg et al. | 5,084,671 A | 1/1992 | Miyata et al. |
| 4,771,234 A | 9/1988 | Cook et al. | 5,089,774 A | 2/1992 | Nakano |
| 4,772,846 A | 9/1988 | Reeds | 5,091,691 A | 2/1992 | Kamieniecki et al. |
| 4,777,434 A | 10/1988 | Miller et al. | 5,091,692 A | 2/1992 | Ohno et al. |
| 4,780,670 A | 10/1988 | Cherry | 5,091,732 A | 2/1992 | Mileski et al. |
| 4,783,625 A | 11/1988 | Harry et al. | 5,094,536 A | 3/1992 | MacDonald et al. |
| 4,784,213 A | 11/1988 | Eager et al. | 5,095,891 A | 3/1992 | Reitter |
| 4,786,867 A | 11/1988 | Yamatsu | 5,097,207 A | 3/1992 | Blanz |
| 4,787,752 A | 11/1988 | Fraser et al. | 5,101,149 A | 3/1992 | Adams et al. |
| 4,791,363 A | 12/1988 | Logan | 5,101,453 A | 3/1992 | Rumbaugh |
| 4,795,962 A | 1/1989 | Yanagawa et al. | 5,103,169 A | 4/1992 | Heaton et al. |
| 4,805,627 A | 2/1989 | Klingenbeck et al. | 5,105,148 A | 4/1992 | Lee |
| 4,810,981 A | 3/1989 | Herstein | 5,105,181 A | 4/1992 | Ross |
| 4,812,754 A | 3/1989 | Tracy et al. | 5,107,076 A | 4/1992 | Bullock et al. |
| 4,816,767 A | 3/1989 | Cannon et al. | 5,136,237 A | 8/1992 | Smith et al. |
| 4,818,169 A | 4/1989 | Schram et al. | 5,142,224 A | 8/1992 | Smith et al. |
| 4,827,211 A | 5/1989 | Strid et al. | 5,144,228 A | 9/1992 | Sorna et al. |
| 4,831,494 A | 5/1989 | Arnold et al. | 5,159,264 A | 10/1992 | Anderson |
| 4,838,802 A | 6/1989 | Soar | 5,159,267 A | 10/1992 | Anderson |
| 4,839,587 A | 6/1989 | Flatley et al. | 5,159,752 A | 11/1992 | Mahant-Shetti et al. |
| 4,845,426 A | 7/1989 | Nolan et al. | 5,160,883 A | 11/1992 | Blanz |
| 4,849,689 A | 7/1989 | Gleason et al. | 5,164,319 A | 11/1992 | Hafeman et al. |
| 4,853,613 A | 8/1989 | Sequeira et al. | 5,164,661 A | 11/1992 | Jones |
| 4,853,624 A | 8/1989 | Rabjohn | 5,166,606 A | 11/1992 | Blanz |
| 4,853,627 A | 8/1989 | Gleason et al. | 5,172,049 A | 12/1992 | Kiyokawa et al. |
| 4,856,426 A | 8/1989 | Wirz | 5,172,051 A | 12/1992 | Zamborelli |
| 4,856,904 A | 8/1989 | Akagawa | 5,187,443 A | 2/1993 | Bereskin |
| 4,858,160 A | 8/1989 | Strid et al. | 5,198,752 A | 3/1993 | Miyata et al. |
| 4,859,989 A | 8/1989 | McPherson | 5,198,753 A | 3/1993 | Hamburgen |
| 4,864,227 A | 9/1989 | Sato | 5,198,756 A | 3/1993 | Jenkins et al. |
| 4,871,883 A | 10/1989 | Guiol | 5,198,758 A | 3/1993 | Iknaian et al. |
| 4,871,965 A | 10/1989 | Elbert et al. | 5,202,558 A | 4/1993 | Barker |
| 4,884,026 A | 11/1989 | Hayakawa et al. | 5,209,088 A | 5/1993 | Vaks |
| 4,884,206 A | 11/1989 | Mate | 5,210,377 A | 5/1993 | Kennedy et al. |
| 4,888,550 A | 12/1989 | Reid | 5,210,485 A | 5/1993 | Kreiger et al. |
| 4,891,584 A | 1/1990 | Kamieniecki et al. | 5,214,243 A | 5/1993 | Johnson |
| 4,893,914 A | 1/1990 | Hancock et al. | 5,214,374 A | 5/1993 | St. Onge |
| 4,894,612 A | 1/1990 | Drake et al. | 5,218,185 A | 6/1993 | Gross |
| 4,896,109 A | 1/1990 | Rauscher | 5,220,277 A | 6/1993 | Reitinger |
| 4,899,998 A | 2/1990 | Teramachi | 5,221,905 A | 6/1993 | Bhangu et al. |
| 4,904,933 A | 2/1990 | Snyder et al. | 5,225,037 A | 7/1993 | Elder et al. |
| 4,904,935 A | 2/1990 | Calma et al. | 5,225,796 A | 7/1993 | Williams et al. |
| 4,906,920 A | 3/1990 | Huff et al. | 5,227,730 A | 7/1993 | King et al. |
| 4,916,398 A | 4/1990 | Rath | 5,232,789 A | 8/1993 | Platz et al. |
| 4,918,279 A | 4/1990 | Babel et al. | 5,233,197 A | 8/1993 | Bowman et al. |
| 4,918,374 A | 4/1990 | Stewart et al. | 5,233,291 A | 8/1993 | Kouno et al. |
| 4,918,383 A | 4/1990 | Huff et al. | 5,233,306 A | 8/1993 | Misra |
| 4,922,128 A | 5/1990 | Dhong et al. | 5,237,267 A | 8/1993 | Harwood et al. |
| 4,922,186 A | 5/1990 | Tsuchiya et al. | 5,245,292 A | 9/1993 | Milesky et al. |
| 4,923,407 A | 5/1990 | Rice et al. | 5,266,889 A | 11/1993 | Harwood et al. |
| 4,926,118 A | 5/1990 | O'Connor et al. | 5,267,088 A | 11/1993 | Nomura |
| 4,929,893 A | 5/1990 | Sato et al. | 5,270,664 A | 12/1993 | McMurtry et al. |
| 4,933,634 A | 6/1990 | Cuzin et al. | 5,274,336 A | 12/1993 | Crook et al. |
| 4,968,931 A | 11/1990 | Littlebury et al. | 5,278,494 A | 1/1994 | Obigane |
| 4,978,907 A | 12/1990 | Smith | 5,280,156 A | 1/1994 | Niori et al. |
| 4,978,914 A | 12/1990 | Akimoto et al. | 5,298,972 A | 3/1994 | Heffner |
| 4,982,153 A | 1/1991 | Collins et al. | 5,303,938 A | 4/1994 | Miller et al. |
| 4,994,737 A | 2/1991 | Carlton et al. | 5,304,924 A | 4/1994 | Yamano et al. |
| 5,001,423 A | 3/1991 | Abrami et al. | 5,315,237 A | 5/1994 | Iwakura et al. |

| Patent | Date | Inventor |
|---|---|---|
| 5,321,352 A | 6/1994 | Takebuchi |
| 5,321,453 A | 6/1994 | Mori et al. |
| 5,325,052 A | 6/1994 | Yamashita |
| 5,334,931 A | 8/1994 | Clarke et al. |
| 5,336,989 A | 8/1994 | Hofer |
| 5,345,170 A | 9/1994 | Schwindt et al. |
| 5,357,211 A | 10/1994 | Bryson et al. |
| 5,363,050 A | 11/1994 | Guo et al. |
| 5,369,368 A | 11/1994 | Kassen et al. |
| 5,369,370 A | 11/1994 | Stratmann et al. |
| 5,371,457 A | 12/1994 | Lipp |
| 5,373,231 A | 12/1994 | Boll et al. |
| 5,374,938 A | 12/1994 | Hatazawa et al. |
| 5,376,790 A | 12/1994 | Linker et al. |
| 5,382,898 A | 1/1995 | Subramanian |
| 5,397,855 A | 3/1995 | Ferlier |
| 5,404,111 A | 4/1995 | Mori et al. |
| 5,408,188 A | 4/1995 | Katoh |
| 5,408,189 A | 4/1995 | Swart et al. |
| 5,410,259 A | 4/1995 | Fujihara et al. |
| 5,412,330 A | 5/1995 | Ravel et al. |
| 5,412,866 A | 5/1995 | Woith et al. |
| 5,414,565 A | 5/1995 | Sullivan et al. |
| 5,422,574 A | 6/1995 | Kister |
| 5,434,512 A | 7/1995 | Schwindt et al. |
| 5,448,172 A | 9/1995 | Dechene et al. |
| 5,451,884 A | 9/1995 | Sauerland |
| 5,457,398 A | 10/1995 | Schwindt et al. |
| 5,461,328 A | 10/1995 | Devereaux et al. |
| 5,467,024 A | 11/1995 | Swapp |
| 5,469,324 A | 11/1995 | Henderson et al. |
| 5,475,316 A | 12/1995 | Hurley et al. |
| 5,477,011 A | 12/1995 | Singles et al. |
| 5,478,748 A | 12/1995 | Akins, Jr. et al. |
| 5,479,108 A | 12/1995 | Cheng |
| 5,479,109 A | 12/1995 | Lau et al. |
| 5,481,196 A | 1/1996 | Nosov |
| 5,481,936 A | 1/1996 | Yanagisawa |
| 5,486,975 A | 1/1996 | Shamouilian et al. |
| 5,488,954 A | 2/1996 | Sleva et al. |
| 5,491,426 A | 2/1996 | Small |
| 5,493,070 A | 2/1996 | Habu |
| 5,493,236 A | 2/1996 | Ishii et al. |
| 5,500,606 A | 3/1996 | Holmes |
| 5,505,150 A | 4/1996 | James et al. |
| 5,506,498 A | 4/1996 | Anderson et al. |
| 5,506,515 A | 4/1996 | Godshalk et al. |
| 5,508,631 A | 4/1996 | Manku et al. |
| 5,510,792 A | 4/1996 | Ono et al. |
| 5,511,010 A | 4/1996 | Burns |
| 5,512,835 A | 4/1996 | Rivera et al. |
| 5,515,167 A | 5/1996 | Ledger et al. |
| 5,517,111 A | 5/1996 | Shelor |
| 5,521,522 A | 5/1996 | Abe et al. |
| 5,523,694 A | 6/1996 | Cole, Jr. |
| 5,528,158 A | 6/1996 | Sinsheimer et al. |
| 5,530,371 A | 6/1996 | Perry et al. |
| 5,530,372 A | 6/1996 | Lee et al. |
| 5,532,609 A | 7/1996 | Harwood et al. |
| 5,539,323 A | 7/1996 | Davis, Jr. |
| 5,539,676 A | 7/1996 | Yamaguchi |
| 5,546,012 A | 8/1996 | Perry et al. |
| 5,550,480 A | 8/1996 | Nelson et al. |
| 5,550,482 A | 8/1996 | Sano |
| 5,552,716 A | 9/1996 | Takahashi et al. |
| 5,554,236 A | 9/1996 | Singles et al. |
| 5,561,377 A | 10/1996 | Strid et al. |
| 5,561,585 A | 10/1996 | Barnes et al. |
| 5,565,788 A | 10/1996 | Burr et al. |
| 5,565,881 A | 10/1996 | Phillips et al. |
| 5,569,591 A | 10/1996 | Kell et al. |
| 5,571,324 A | 11/1996 | Sago et al. |
| 5,572,398 A | 11/1996 | Federlin et al. |
| 5,578,932 A | 11/1996 | Adamian |
| 5,583,445 A | 12/1996 | Mullen |
| 5,584,608 A | 12/1996 | Gillespie |
| 5,594,358 A | 1/1997 | Ishikawa et al. |
| 5,600,256 A | 2/1997 | Woith et al. |
| 5,604,444 A | 2/1997 | Harwood et al. |
| 5,610,529 A | 3/1997 | Schwindt |
| 5,611,946 A | 3/1997 | Leong et al. |
| 5,617,035 A | 4/1997 | Swapp |
| 5,628,057 A | 5/1997 | Phillips et al. |
| 5,629,631 A | 5/1997 | Perry et al. |
| 5,631,571 A | 5/1997 | Spaziani et al. |
| 5,633,780 A | 5/1997 | Cronin |
| 5,640,101 A | 6/1997 | Kuji et al. |
| 5,642,298 A | 6/1997 | Mallory et al. |
| 5,644,248 A | 7/1997 | Fujimoto |
| 5,646,538 A | 7/1997 | Lide et al. |
| 5,653,939 A | 8/1997 | Hollis et al. |
| 5,656,942 A | 8/1997 | Watts et al. |
| 5,657,394 A | 8/1997 | Schwartz et al. |
| 5,659,255 A | 8/1997 | Strid et al. |
| 5,659,421 A | 8/1997 | Rahmel et al. |
| 5,663,653 A | 9/1997 | Schwindt et al. |
| 5,666,063 A | 9/1997 | Abercrombie et al. |
| 5,668,470 A | 9/1997 | Shelor |
| 5,669,316 A | 9/1997 | Faz et al. |
| 5,670,322 A | 9/1997 | Eggers et al. |
| 5,670,888 A | 9/1997 | Cheng |
| 5,672,816 A | 9/1997 | Park et al. |
| 5,675,499 A | 10/1997 | Lee et al. |
| 5,675,932 A | 10/1997 | Mauney |
| 5,676,360 A | 10/1997 | Boucher et al. |
| 5,680,039 A | 10/1997 | Mochizuki et al. |
| 5,682,337 A | 10/1997 | El-Fishaway et al. |
| 5,685,232 A | 11/1997 | Inoue |
| 5,704,355 A | 1/1998 | Bridges |
| 5,712,571 A | 1/1998 | O'Donoghue |
| 5,715,819 A | 2/1998 | Svenson et al. |
| 5,729,150 A | 3/1998 | Schwindt |
| 5,731,708 A | 3/1998 | Sobhami |
| 5,731,920 A | 3/1998 | Katsuragawa |
| 5,744,971 A | 4/1998 | Chan et al. |
| 5,748,506 A | 5/1998 | Bockelman |
| 5,751,252 A | 5/1998 | Phillips |
| 5,767,690 A | 6/1998 | Fujimoto |
| 5,773,951 A | 6/1998 | Markowski et al. |
| 5,777,485 A | 7/1998 | Tanaka et al. |
| 5,792,668 A | 8/1998 | Fuller et al. |
| 5,793,213 A | 8/1998 | Bockelman et al. |
| 5,794,133 A | 8/1998 | Kashima |
| 5,798,652 A | 8/1998 | Taraci |
| 5,802,856 A | 9/1998 | Schaper et al. |
| 5,804,982 A | 9/1998 | Lo et al. |
| 5,804,983 A | 9/1998 | Nakajima et al. |
| 5,807,107 A | 9/1998 | Bright et al. |
| 5,811,751 A | 9/1998 | Leong et al. |
| 5,824,494 A | 10/1998 | Feldberg |
| 5,828,225 A | 10/1998 | Obikane et al. |
| 5,829,437 A | 11/1998 | Bridges |
| 5,831,442 A | 11/1998 | Heigl |
| 5,833,601 A | 11/1998 | Swartz et al. |
| 5,835,997 A | 11/1998 | Yassine et al. |
| 5,838,161 A | 11/1998 | Akram et al. |
| 5,841,288 A | 11/1998 | Meaney et al. |
| 5,846,708 A | 12/1998 | Hollis et al. |
| 5,847,569 A | 12/1998 | Ho et al. |
| 5,848,500 A | 12/1998 | Kirk |
| 5,852,232 A | 12/1998 | Samsavar et al. |
| 5,854,608 A | 12/1998 | Leisten |
| 5,857,667 A | 1/1999 | Lee |
| 5,861,743 A | 1/1999 | Pye et al. |
| 5,867,073 A | 2/1999 | Weinreb et al. |
| 5,869,326 A | 2/1999 | Hofmann |

| | | | | | | |
|---|---|---|---|---|---|---|
| 5,869,975 A | 2/1999 | Strid et al. | | 6,121,783 A | 9/2000 | Horner et al. |
| 5,874,361 A | 2/1999 | Collins et al. | | 6,124,723 A | 9/2000 | Costello |
| 5,879,289 A | 3/1999 | Yarush et al. | | 6,124,725 A | 9/2000 | Sato |
| 5,883,522 A | 3/1999 | O'Boyle | | 6,127,831 A | 10/2000 | Khoury et al. |
| 5,883,523 A | 3/1999 | Ferland et al. | | 6,130,544 A | 10/2000 | Strid et al. |
| 5,888,075 A | 3/1999 | Hasegawa et al. | | 6,137,302 A | 10/2000 | Schwindt |
| 5,892,539 A | 4/1999 | Colvin | | 6,137,303 A | 10/2000 | Deckert et al. |
| 5,900,737 A | 5/1999 | Graham et al. | | 6,144,212 A | 11/2000 | Mizuta |
| 5,903,143 A | 5/1999 | Mochizuki et al. | | 6,147,502 A | 11/2000 | Fryer et al. |
| 5,905,421 A | 5/1999 | Oldfield | | 6,147,851 A | 11/2000 | Anderson |
| 5,910,727 A | 6/1999 | Fujihara et al. | | 6,160,407 A | 12/2000 | Nikawa |
| 5,916,689 A | 6/1999 | Collins et al. | | 6,161,294 A | 12/2000 | Bland et al. |
| 5,923,177 A | 7/1999 | Wardwell | | 6,166,553 A | 12/2000 | Sinsheimer |
| 5,926,028 A | 7/1999 | Mochizuki | | 6,169,410 B1 | 1/2001 | Grace et al. |
| 5,942,907 A | 8/1999 | Chiang | | 6,172,337 B1 | 1/2001 | Johnsgard et al. |
| 5,944,093 A | 8/1999 | Viswanath | | 6,175,228 B1 | 1/2001 | Zamborelli et al. |
| 5,945,836 A | 8/1999 | Sayre et al. | | 6,181,144 B1 | 1/2001 | Hembree et al. |
| 5,949,383 A | 9/1999 | Hayes et al. | | 6,181,149 B1 | 1/2001 | Godfrey et al. |
| 5,949,579 A | 9/1999 | Baker | | 6,181,297 B1 | 1/2001 | Leisten |
| 5,952,842 A | 9/1999 | Fujimoto | | 6,181,416 B1 | 1/2001 | Falk |
| 5,959,461 A | 9/1999 | Brown et al. | | 6,184,845 B1 | 2/2001 | Leisten et al. |
| 5,960,411 A | 9/1999 | Hartman et al. | | 6,191,596 B1 | 2/2001 | Abiko |
| 5,963,027 A | 10/1999 | Peters | | 6,194,720 B1 | 2/2001 | Li et al. |
| 5,963,364 A | 10/1999 | Leong et al. | | 6,194,907 B1 | 2/2001 | Kanao et al. |
| 5,970,429 A | 10/1999 | Martin | | 6,198,299 B1 | 3/2001 | Hollman |
| 5,973,505 A | 10/1999 | Strid et al. | | 6,211,663 B1 | 4/2001 | Moulthrop et al. |
| 5,974,662 A | 11/1999 | Eldridge et al. | | 6,211,837 B1 | 4/2001 | Crouch et al. |
| 5,981,268 A | 11/1999 | Kovacs et al. | | 6,215,295 B1 | 4/2001 | Smith, III |
| 5,982,166 A | 11/1999 | Mautz | | 6,222,031 B1 | 4/2001 | Wakabayashi et al. |
| 5,993,611 A | 11/1999 | Moroney, III et al. | | 6,222,970 B1 | 4/2001 | Wach et al. |
| 5,995,914 A | 11/1999 | Cabot | | 6,229,322 B1 | 5/2001 | Hembree |
| 5,996,102 A | 11/1999 | Haulin | | 6,229,327 B1 | 5/2001 | Boll et al. |
| 5,998,768 A | 12/1999 | Hunter et al. | | 6,232,787 B1 | 5/2001 | Lo et al. |
| 5,999,268 A | 12/1999 | Yonezawa et al. | | 6,232,788 B1 | 5/2001 | Schwindt et al. |
| 6,001,760 A | 12/1999 | Katsuda et al. | | 6,232,789 B1 | 5/2001 | Schwindt |
| 6,002,236 A | 12/1999 | Trant et al. | | 6,232,790 B1 | 5/2001 | Bryan et al. |
| 6,002,263 A * | 12/1999 | Peters et al. ................. 324/754 | | 6,233,613 B1 | 5/2001 | Walker et al. |
| 6,002,426 A | 12/1999 | Back et al. | | 6,236,223 B1 | 5/2001 | Brady et al. |
| 6,013,586 A | 1/2000 | McGhee et al. | | 6,236,975 B1 | 5/2001 | Boe et al. |
| 6,019,612 A | 2/2000 | Hasegawa et al. | | 6,236,977 B1 | 5/2001 | Verba et al. |
| 6,023,209 A | 2/2000 | Faulkner et al. | | 6,242,929 B1 | 6/2001 | Mizuta |
| 6,028,435 A | 2/2000 | Nikawa | | 6,245,692 B1 | 6/2001 | Pearce et al. |
| 6,029,141 A | 2/2000 | Bezos et al. | | 6,251,595 B1 | 6/2001 | Gordon et al. |
| 6,031,383 A | 2/2000 | Streib et al. | | 6,252,392 B1 | 6/2001 | Peters |
| 6,032,714 A | 3/2000 | Fenton | | 6,257,319 B1 | 7/2001 | Kainuma et al. |
| 6,034,533 A | 3/2000 | Tervo et al. | | 6,257,564 B1 | 7/2001 | Avneri et al. |
| 6,037,785 A | 3/2000 | Higgins | | 6,259,261 B1 | 7/2001 | Engelking et al. |
| 6,037,793 A | 3/2000 | Miyazawa et al. | | 6,265,950 B1 | 7/2001 | Schmidt et al. |
| 6,043,667 A | 3/2000 | Cadwallader et al. | | 6,271,673 B1 | 8/2001 | Furuta et al. |
| 6,043,668 A | 3/2000 | Carney | | 6,275,738 B1 | 8/2001 | Kasevich et al. |
| 6,049,216 A | 4/2000 | Yang et al. | | 6,278,051 B1 | 8/2001 | Peabody |
| 6,051,422 A | 4/2000 | Kovacs et al. | | 6,278,411 B1 | 8/2001 | Ohlsson et al. |
| 6,052,653 A | 4/2000 | Mazur et al. | | 6,281,691 B1 | 8/2001 | Matsunaga et al. |
| 6,054,869 A | 4/2000 | Hutton et al. | | 6,284,971 B1 | 9/2001 | Atalar et al. |
| 6,060,888 A | 5/2000 | Blackham et al. | | 6,288,557 B1 | 9/2001 | Peters et al. |
| 6,060,891 A | 5/2000 | Hembree et al. | | 6,292,760 B1 | 9/2001 | Burns |
| 6,060,892 A | 5/2000 | Yamagata | | 6,300,775 B1 | 10/2001 | Peach et al. |
| 6,061,589 A | 5/2000 | Bridges et al. | | 6,307,672 B1 | 10/2001 | DeNure |
| 6,064,213 A | 5/2000 | Khandros et al. | | 6,310,483 B1 | 10/2001 | Taura et al. |
| 6,064,217 A | 5/2000 | Smith | | 6,310,755 B1 | 10/2001 | Kholodenko et al. |
| 6,064,218 A | 5/2000 | Godfrey et al. | | 6,313,567 B1 | 11/2001 | Maltabes et al. |
| 6,066,911 A | 5/2000 | Lindemann et al. | | 6,313,649 B2 | 11/2001 | Harwood et al. |
| 6,078,183 A | 6/2000 | Cole, Jr. | | 6,320,372 B1 | 11/2001 | Keller |
| 6,091,236 A | 7/2000 | Piety et al. | | 6,320,396 B1 | 11/2001 | Nikawa |
| 6,091,255 A | 7/2000 | Godfrey | | 6,327,034 B1 | 12/2001 | Hoover et al. |
| 6,096,567 A | 8/2000 | Kaplan et al. | | 6,335,625 B1 | 1/2002 | Bryant et al. |
| 6,100,815 A | 8/2000 | Pailthorp | | 6,335,628 B2 | 1/2002 | Schwindt et al. |
| 6,104,203 A | 8/2000 | Costello et al. | | 6,340,568 B2 | 1/2002 | Hefti |
| 6,104,206 A | 8/2000 | Verkuil | | 6,340,895 B1 | 1/2002 | Uher et al. |
| 6,111,419 A | 8/2000 | Lefever et al. | | 6,359,456 B1 | 3/2002 | Hembree et al. |
| 6,114,865 A | 9/2000 | Lagowski et al. | | 6,362,636 B1 | 3/2002 | Peters et al. |
| 6,118,287 A | 9/2000 | Boll et al. | | 6,362,792 B1 | 3/2002 | Sawamura et al. |
| 6,118,894 A | 9/2000 | Schwartz et al. | | 6,366,247 B1 | 4/2002 | Sawamura et al. |

| Patent | Kind | Date | Name |
|---|---|---|---|
| 6,369,776 | B1 | 4/2002 | Leisten et al. |
| 6,376,258 | B2 | 4/2002 | Hefti |
| 6,380,751 | B2 | 4/2002 | Harwood et al. |
| 6,384,614 | B1 | 5/2002 | Hager et al. |
| 6,395,480 | B1 | 5/2002 | Hefti |
| 6,396,296 | B1 | 5/2002 | Tartar et al. |
| 6,396,298 | B1 | 5/2002 | Young et al. |
| 6,400,168 | B2 | 6/2002 | Matsunaga et al. |
| 6,404,213 | B2 | 6/2002 | Noda |
| 6,407,560 | B1 | 6/2002 | Walraven et al. |
| 6,407,562 | B1 | 6/2002 | Whiteman |
| 6,409,724 | B1 | 6/2002 | Penny et al. |
| 6,414,478 | B1 | 7/2002 | Suzuki |
| 6,415,858 | B1 | 7/2002 | Getchel et al. |
| 6,418,009 | B1 | 7/2002 | Brunette |
| 6,420,722 | B2 | 7/2002 | Moore et al. |
| 6,424,141 | B1 | 7/2002 | Hollman et al. |
| 6,424,316 | B1 | 7/2002 | Leisten et al. |
| 6,445,202 | B1 | 9/2002 | Cowan et al. |
| 6,447,339 | B1 | 9/2002 | Reed et al. |
| 6,448,788 | B1 | 9/2002 | Meaney et al. |
| 6,459,739 | B1 | 10/2002 | Vitenberg |
| 6,466,046 | B1 | 10/2002 | Maruyama et al. |
| 6,468,816 | B2 | 10/2002 | Hunter |
| 6,476,442 | B1 | 11/2002 | Williams et al. |
| 6,480,013 | B1 | 11/2002 | Nayler et al. |
| 6,481,939 | B1 | 11/2002 | Gillespie et al. |
| 6,483,327 | B1 | 11/2002 | Bruce et al. |
| 6,483,336 | B1 | 11/2002 | Harris et al. |
| 6,486,687 | B2 | 11/2002 | Harwood et al. |
| 6,488,405 | B1 | 12/2002 | Eppes et al. |
| 6,489,789 | B2 | 12/2002 | Peters et al. |
| 6,490,471 | B2 | 12/2002 | Svenson et al. |
| 6,492,822 | B2 | 12/2002 | Schwindt et al. |
| 6,501,289 | B1 | 12/2002 | Takekoshi |
| 6,512,391 | B2 | 1/2003 | Cowan et al. |
| 6,512,482 | B1 | 1/2003 | Nelson et al. |
| 6,515,494 | B1 | 2/2003 | Low |
| 6,528,993 | B1 | 3/2003 | Shin et al. |
| 6,529,844 | B1 | 3/2003 | Kapetanic et al. |
| 6,548,311 | B1 | 4/2003 | Knoll |
| 6,549,022 | B1 | 4/2003 | Cole, Jr. et al. |
| 6,549,026 | B1 | 4/2003 | Dibattista et al. |
| 6,549,106 | B2 | 4/2003 | Martin |
| 6,566,079 | B2 | 5/2003 | Hefti |
| 6,573,702 | B2 | 6/2003 | Marcuse et al. |
| 6,578,264 | B1 | 6/2003 | Gleason et al. |
| 6,580,283 | B1 | 6/2003 | Carbone et al. |
| 6,582,979 | B2 | 6/2003 | Coccioli et al. |
| 6,587,327 | B1 | 7/2003 | Devoe et al. |
| 6,603,322 | B1 | 8/2003 | Boll et al. |
| 6,605,951 | B1 | 8/2003 | Cowan |
| 6,605,955 | B1 | 8/2003 | Costello et al. |
| 6,608,494 | B1 | 8/2003 | Bruce et al. |
| 6,608,496 | B1 | 8/2003 | Strid et al. |
| 6,611,417 | B2 | 8/2003 | Chen |
| 6,617,862 | B1 | 9/2003 | Bruce |
| 6,621,082 | B2 | 9/2003 | Morita et al. |
| 6,624,891 | B2 | 9/2003 | Marcus et al. |
| 6,627,461 | B2 | 9/2003 | Chapman et al. |
| 6,628,503 | B2 | 9/2003 | Sogard |
| 6,628,980 | B2 | 9/2003 | Atalar et al. |
| 6,633,174 | B1 | 10/2003 | Satya et al. |
| 6,636,059 | B2 | 10/2003 | Harwood et al. |
| 6,636,182 | B2 | 10/2003 | Mehltretter |
| 6,639,415 | B2 | 10/2003 | Peters et al. |
| 6,639,461 | B1 | 10/2003 | Tam et al. |
| 6,642,732 | B2 | 11/2003 | Cowan et al. |
| 6,643,597 | B1 | 11/2003 | Dunsmore |
| 6,650,135 | B1 | 11/2003 | Mautz et al. |
| 6,653,903 | B2 | 11/2003 | Leich et al. |
| 6,657,214 | B1 | 12/2003 | Foegelle et al. |
| 6,657,601 | B2 | 12/2003 | McLean |
| 6,686,753 | B1 | 2/2004 | Kitahata |
| 6,701,265 | B2 | 3/2004 | Hill et al. |
| 6,707,548 | B2 | 3/2004 | Kreimer et al. |
| 6,710,798 | B1 | 3/2004 | Hershel et al. |
| 6,717,426 | B2 | 4/2004 | Iwasaki |
| 6,720,782 | B2 | 4/2004 | Schwindt et al. |
| 6,724,205 | B1 | 4/2004 | Hayden et al. |
| 6,724,928 | B1 | 4/2004 | Davis |
| 6,727,716 | B1 | 4/2004 | Sharif |
| 6,731,804 | B1 | 5/2004 | Carrieri et al. |
| 6,734,687 | B1 | 5/2004 | Ishitani et al. |
| 6,737,920 | B2 | 5/2004 | Jen et al. |
| 6,739,208 | B2 | 5/2004 | Hyakudomi |
| 6,744,268 | B2 | 6/2004 | Hollman |
| 6,753,679 | B1 | 6/2004 | Kwong et al. |
| 6,753,699 | B2 | 6/2004 | Stockstad |
| 6,756,751 | B2 | 6/2004 | Hunter |
| 6,768,328 | B2 | 7/2004 | Self et al. |
| 6,770,955 | B1 | 8/2004 | Coccioli et al. |
| 6,771,090 | B2 | 8/2004 | Harris et al. |
| 6,771,806 | B1 | 8/2004 | Satya et al. |
| 6,774,651 | B1 | 8/2004 | Hembree |
| 6,777,964 | B2 | 8/2004 | Navratil et al. |
| 6,778,140 | B1 | 8/2004 | Yeh |
| 6,784,679 | B2 | 8/2004 | Sweet et al. |
| 6,788,093 | B2 | 9/2004 | Aitren et al. |
| 6,791,344 | B2 | 9/2004 | Cook et al. |
| 6,794,888 | B2 | 9/2004 | Kawaguchi et al. |
| 6,794,950 | B2 | 9/2004 | Du Toit et al. |
| 6,798,226 | B2 | 9/2004 | Altmann et al. |
| 6,801,047 | B2 | 10/2004 | Harwood et al. |
| 6,806,724 | B2 | 10/2004 | Hayden et al. |
| 6,806,836 | B2 | 10/2004 | Ogawa et al. |
| 6,809,533 | B1 | 10/2004 | Anlage et al. |
| 6,812,718 | B1 | 11/2004 | Chong et al. |
| 6,822,463 | B1 | 11/2004 | Jacobs |
| 6,836,135 | B2 | 12/2004 | Harris et al. |
| 6,838,885 | B2 | 1/2005 | Kamitani |
| 6,842,024 | B2 | 1/2005 | Peters et al. |
| 6,843,024 | B2 | 1/2005 | Nozaki et al. |
| 6,847,219 | B1 | 1/2005 | Lesher et al. |
| 6,856,129 | B2 | 2/2005 | Thomas et al. |
| 6,861,856 | B2 | 3/2005 | Dunklee et al. |
| 6,864,694 | B2 | 3/2005 | McTigue |
| 6,873,167 | B2 | 3/2005 | Goto et al. |
| 6,885,197 | B2 | 4/2005 | Harris et al. |
| 6,900,646 | B2 | 5/2005 | Kasukabe et al. |
| 6,900,647 | B2 | 5/2005 | Yoshida et al. |
| 6,900,652 | B2 | 5/2005 | Mazur |
| 6,900,653 | B2 | 5/2005 | Yu et al. |
| 6,902,941 | B2 | 6/2005 | Sun |
| 6,903,563 | B2 | 6/2005 | Yoshida et al. |
| 6,914,244 | B2 | 7/2005 | Alani |
| 6,914,580 | B2 | 7/2005 | Leisten |
| 6,924,656 | B2 | 8/2005 | Matsumoto |
| 6,927,079 | B1 | 8/2005 | Fyfield |
| 6,937,341 | B1 | 8/2005 | Woollam et al. |
| 6,965,226 | B2 | 11/2005 | Dunklee |
| 6,970,001 | B2 | 11/2005 | Chheda et al. |
| 6,987,483 | B2 | 1/2006 | Tran |
| 7,001,785 | B1 | 2/2006 | Chen |
| 7,002,133 | B2 | 2/2006 | Beausoleil et al. |
| 7,002,363 | B2 | 2/2006 | Mathieu |
| 7,002,364 | B2 | 2/2006 | Kang et al. |
| 7,003,184 | B2 | 2/2006 | Ronnekleiv et al. |
| 7,005,842 | B2 | 2/2006 | Fink et al. |
| 7,005,868 | B2 | 2/2006 | McTigue |
| 7,005,879 | B1 | 2/2006 | Robertazzi |
| 7,006,046 | B2 | 2/2006 | Aisenbrey |
| 7,007,380 | B2 | 3/2006 | Das et al. |
| 7,009,188 | B2 | 3/2006 | Wang |
| 7,009,383 | B2 | 3/2006 | Harwood et al. |
| 7,009,415 | B2 | 3/2006 | Kobayashi et al. |

| Patent/Pub No. | Date | Name |
|---|---|---|
| 7,011,531 B2 | 3/2006 | Egitto et al. |
| 7,012,425 B2 | 3/2006 | Shoji |
| 7,012,441 B2 | 3/2006 | Chou et al. |
| 7,013,221 B1 | 3/2006 | Friend et al. |
| 7,014,499 B2 | 3/2006 | Yoon |
| 7,015,455 B2 | 3/2006 | Mitsuoka et al. |
| 7,015,689 B2 | 3/2006 | Kasajima et al. |
| 7,015,690 B2 | 3/2006 | Wang et al. |
| 7,015,703 B2 | 3/2006 | Hopkins et al. |
| 7,015,707 B2 | 3/2006 | Cherian |
| 7,015,708 B2 | 3/2006 | Beckous et al. |
| 7,015,709 B2 | 3/2006 | Capps et al. |
| 7,015,710 B2 | 3/2006 | Yoshida et al. |
| 7,015,711 B2 | 3/2006 | Rothaug et al. |
| 7,019,541 B2 | 3/2006 | Kittrell |
| 7,019,544 B1 | 3/2006 | Jacobs et al. |
| 7,019,701 B2 | 3/2006 | Ohno et al. |
| 7,020,360 B2 | 3/2006 | Satomura et al. |
| 7,020,363 B2 | 3/2006 | Johannessen |
| 7,022,976 B1 | 4/2006 | Santana, Jr. et al. |
| 7,022,985 B2 | 4/2006 | Knebel et al. |
| 7,023,225 B2 | 4/2006 | Blackwood |
| 7,023,226 B2 | 4/2006 | Okumura et al. |
| 7,023,229 B2 | 4/2006 | Maesaki et al. |
| 7,023,231 B2 | 4/2006 | Howland, Jr. et al. |
| 7,025,628 B2 | 4/2006 | LaMeres et al. |
| 7,026,832 B2 | 4/2006 | Chaya et al. |
| 7,026,833 B2 | 4/2006 | Rincon et al. |
| 7,026,834 B2 | 4/2006 | Hwang |
| 7,026,835 B2 | 4/2006 | Farnworth et al. |
| 7,030,599 B2 | 4/2006 | Douglas |
| 7,030,827 B2 | 4/2006 | Mahler et al. |
| 7,032,307 B2 | 4/2006 | Matsunaga et al. |
| 7,034,553 B2 | 4/2006 | Gilboe |
| 7,035,738 B2 | 4/2006 | Matsumoto et al. |
| 7,088,981 B2 | 8/2006 | Chang |
| 7,096,133 B1 | 8/2006 | Martin et al. |
| 7,101,797 B2 | 9/2006 | Yuasa |
| 7,138,813 B2 | 11/2006 | Cowan et al. |
| 7,187,188 B2 | 3/2007 | Andrews et al. |
| 7,188,037 B2 | 3/2007 | Hidehira |
| 7,221,172 B2 | 5/2007 | Dunklee |
| 7,250,779 B2 | 7/2007 | Dunklee et al. |
| 7,352,168 B2 | 4/2008 | Dunkee |
| 7,362,115 B2 | 4/2008 | Andrews et al. |
| 7,423,419 B2 | 9/2008 | Dunklee |
| 7,501,810 B2 | 3/2009 | Dunklee |
| 7,514,915 B2 | 4/2009 | Dunklee |
| 7,518,358 B2 | 4/2009 | Dunklee |
| 2001/0002794 A1 | 6/2001 | Draving et al. |
| 2001/0009377 A1 | 7/2001 | Schwindt et al. |
| 2001/0010468 A1 | 8/2001 | Gleason et al. |
| 2001/0020283 A1 | 9/2001 | Sakaguchi |
| 2001/0024116 A1 | 9/2001 | Draving |
| 2001/0030549 A1 | 10/2001 | Gleason et al. |
| 2001/0043073 A1 | 11/2001 | Montoya |
| 2001/0044152 A1 | 11/2001 | Burnett |
| 2001/0045511 A1 | 11/2001 | Moore et al. |
| 2001/0054906 A1 | 12/2001 | Fujimura |
| 2002/0005728 A1 | 1/2002 | Babson et al. |
| 2002/0008533 A1 | 1/2002 | Ito et al. |
| 2002/0009377 A1 | 1/2002 | Shafer |
| 2002/0009378 A1 | 1/2002 | Obara |
| 2002/0011859 A1 | 1/2002 | Smith et al. |
| 2002/0011863 A1 | 1/2002 | Takahashi et al. |
| 2002/0050828 A1 | 5/2002 | Seward, IV et al. |
| 2002/0066551 A1 | 6/2002 | Stone et al. |
| 2002/0070743 A1 | 6/2002 | Felici et al. |
| 2002/0070745 A1 | 6/2002 | Johnson et al. |
| 2002/0075027 A1 | 6/2002 | Hollman et al. |
| 2002/0079911 A1 | 6/2002 | Schwindt |
| 2002/0118009 A1 | 8/2002 | Hollman et al. |
| 2002/0118034 A1 | 8/2002 | Laureanti |
| 2002/0149377 A1 | 10/2002 | Hefti et al. |
| 2002/0153909 A1 | 10/2002 | Petersen et al. |
| 2002/0163769 A1 | 11/2002 | Brown |
| 2002/0168659 A1 | 11/2002 | Hefti et al. |
| 2002/0180466 A1 | 12/2002 | Hiramatsu et al. |
| 2002/0197709 A1 | 12/2002 | Van der Weide et al. |
| 2003/0010877 A1 | 1/2003 | Landreville et al. |
| 2003/0030822 A1 | 2/2003 | Finarov |
| 2003/0032000 A1 | 2/2003 | Liu et al. |
| 2003/0040004 A1 | 2/2003 | Hefti et al. |
| 2003/0057513 A1 | 3/2003 | Leedy |
| 2003/0062915 A1 | 4/2003 | Arnold et al. |
| 2003/0071631 A1 | 4/2003 | Alexander |
| 2003/0072549 A1 | 4/2003 | Facer et al. |
| 2003/0077649 A1 | 4/2003 | Cho et al. |
| 2003/0088180 A1 | 5/2003 | VanVeen et al. |
| 2003/0119057 A1 | 6/2003 | Gascoyne et al. |
| 2003/0139662 A1 | 7/2003 | Seidman |
| 2003/0139790 A1 | 7/2003 | Ingle et al. |
| 2003/0141861 A1 | 7/2003 | Navratil et al. |
| 2003/0155939 A1 | 8/2003 | Lutz et al. |
| 2003/0156270 A1 | 8/2003 | Hunter |
| 2003/0170898 A1 | 9/2003 | Gunderson et al. |
| 2003/0184332 A1 | 10/2003 | Tomimatsu et al. |
| 2004/0015060 A1 | 1/2004 | Samsoondar et al. |
| 2004/0021475 A1 | 2/2004 | Ito et al. |
| 2004/0061514 A1 | 4/2004 | Schwindt et al. |
| 2004/0066181 A1 | 4/2004 | Thies |
| 2004/0069776 A1 | 4/2004 | Fagrell et al. |
| 2004/0090223 A1 | 5/2004 | Yonezawa |
| 2004/0095145 A1 | 5/2004 | Boudiaf et al. |
| 2004/0095641 A1 | 5/2004 | Russum et al. |
| 2004/0100276 A1 | 5/2004 | Fanton |
| 2004/0100297 A1 | 5/2004 | Tanioka et al. |
| 2004/0108847 A1 | 6/2004 | Stoll et al. |
| 2004/0113639 A1 | 6/2004 | Dunklee et al. |
| 2004/0113640 A1 | 6/2004 | Cooper et al. |
| 2004/0130787 A1 | 7/2004 | Thome-Forster et al. |
| 2004/0132222 A1 | 7/2004 | Hembree et al. |
| 2004/0134899 A1 | 7/2004 | Hiramatsu et al. |
| 2004/0147034 A1 | 7/2004 | Gore et al. |
| 2004/0162689 A1 | 8/2004 | Jamneala et al. |
| 2004/0175294 A1 | 9/2004 | Ellison et al. |
| 2004/0186382 A1 | 9/2004 | Modell et al. |
| 2004/0193382 A1 | 9/2004 | Adamian et al. |
| 2004/0197771 A1 | 10/2004 | Powers et al. |
| 2004/0199350 A1 | 10/2004 | Blackham et al. |
| 2004/0207072 A1 | 10/2004 | Hiramatsu et al. |
| 2004/0207424 A1 | 10/2004 | Hollman |
| 2004/0239338 A1 | 12/2004 | Jonsson et al. |
| 2004/0246004 A1 | 12/2004 | Heuermann |
| 2004/0251922 A1 | 12/2004 | Martens et al. |
| 2004/0267691 A1 | 12/2004 | Vasudeva |
| 2005/0024069 A1 | 2/2005 | Hayden et al. |
| 2005/0026276 A1 | 2/2005 | Chou |
| 2005/0030047 A1 | 2/2005 | Adamian |
| 2005/0054029 A1 | 3/2005 | Tomimatsu et al. |
| 2005/0062533 A1 | 3/2005 | Vice |
| 2005/0083130 A1 | 4/2005 | Grilo |
| 2005/0099192 A1 | 5/2005 | Dunklee et al. |
| 2005/0101846 A1 | 5/2005 | Fine et al. |
| 2005/0156675 A1 | 7/2005 | Rohde et al. |
| 2005/0164160 A1 | 7/2005 | Gunter et al. |
| 2005/0165316 A1 | 7/2005 | Lowery et al. |
| 2005/0168722 A1 | 8/2005 | Forstner et al. |
| 2005/0174191 A1 | 8/2005 | Brunker et al. |
| 2005/0178980 A1 | 8/2005 | Skidmore et al. |
| 2005/0195124 A1 | 9/2005 | Puente Baliarda et al. |
| 2005/0227503 A1 | 10/2005 | Reitinger |
| 2005/0236587 A1 | 10/2005 | Kodama et al. |
| 2005/0237102 A1 | 10/2005 | Tanaka |
| 2006/0052075 A1 | 3/2006 | Galivanche et al. |
| 2006/0114012 A1 | 6/2006 | Reitinger |

| | | | | | |
|---|---|---|---|---|---|
| 2006/0155270 | A1 | 7/2006 | Hancock et al. | | |
| 2006/0158207 | A1 | 7/2006 | Reitinger | | |
| 2006/0226864 | A1 | 10/2006 | Kramer | | |
| 2007/0024506 | A1 | 2/2007 | Hardacker | | |
| 2007/0030021 | A1 | 2/2007 | Cowan et al. | | |

FOREIGN PATENT DOCUMENTS

| | | |
|---|---|---|
| DE | 31 14 466 | 3/1982 |
| DE | 31 25 552 | 11/1982 |
| DE | 36 37 549 | 5/1988 |
| DE | 41 09 908 | 10/1992 |
| DE | 43 16 111 | 11/1994 |
| DE | 94 06 227 | 10/1995 |
| DE | 195 41 334 | 9/1996 |
| DE | 196 16 212 | 10/1996 |
| DE | 195 22 774 | 1/1997 |
| DE | 196 18 717 | 1/1998 |
| DE | 288 234 | 3/1999 |
| DE | 693 22 206 | 4/1999 |
| DE | 100 00 324 | 7/2001 |
| EP | 0 087 497 | 9/1983 |
| EP | 0 201 205 | 12/1986 |
| EP | 0 314 481 | 5/1989 |
| EP | 0 333 521 | 9/1989 |
| EP | 0 460 911 | 12/1991 |
| EP | 0 574 149 | 5/1993 |
| EP | 0 706 210 | 4/1996 |
| EP | 0 505 981 | 6/1998 |
| EP | 0 573 183 | 1/1999 |
| EP | 0 945 736 | 9/1999 |
| GB | 2 197 081 | 5/1988 |
| JP | 53-037077 | 4/1978 |
| JP | 53-052354 | 5/1978 |
| JP | 55-115383 | 9/1980 |
| JP | 56-007439 | 1/1981 |
| JP | 56-88333 | 7/1981 |
| JP | 57-075480 | 5/1982 |
| JP | 57-163035 | 10/1982 |
| JP | 62-011243 | 1/1987 |
| JP | 62-11243 | 1/1987 |
| JP | 62-51235 | 3/1987 |
| JP | 62-098634 | 5/1987 |
| JP | 62-107937 | 5/1987 |
| JP | 62-239050 | 10/1987 |
| JP | 63-108736 | 5/1988 |
| JP | 63-129640 | 6/1988 |
| JP | 63-143814 | 6/1988 |
| JP | 63-160355 | 7/1988 |
| JP | 63-318745 | 12/1988 |
| JP | 1-165968 | 6/1989 |
| JP | 1-178872 | 7/1989 |
| JP | 1-209380 | 8/1989 |
| JP | 1-214038 | 8/1989 |
| JP | 1-219575 | 9/1989 |
| JP | 1-296167 | 11/1989 |
| JP | 2-22836 | 1/1990 |
| JP | 2-22837 | 1/1990 |
| JP | 2-22873 | 1/1990 |
| JP | 2-124469 | 5/1990 |
| JP | 2-191352 | 7/1990 |
| JP | 2-220453 | 9/1990 |
| JP | 3-67187 | 3/1991 |
| JP | 3-175367 | 7/1991 |
| JP | 3-196206 | 8/1991 |
| JP | 3-228348 | 10/1991 |
| JP | 4-732 | 1/1992 |
| JP | 4-130639 | 5/1992 |
| JP | 4-159043 | 6/1992 |
| JP | 4-206930 | 7/1992 |
| JP | 4-340248 | 11/1992 |
| JP | 5-8476 | 2/1993 |
| JP | 5-082631 | 4/1993 |
| JP | 5-157790 | 6/1993 |
| JP | 51-57790 | 6/1993 |
| JP | 5-166893 | 7/1993 |
| JP | 51-66893 | 7/1993 |
| JP | 6-85044 | 3/1994 |
| JP | 60-71425 | 3/1994 |
| JP | 6-102313 | 4/1994 |
| JP | 6-132709 | 5/1994 |
| JP | 7-005078 | 1/1995 |
| JP | 7-5197 | 1/1995 |
| JP | 7-12871 | 1/1995 |
| JP | 7-84003 | 3/1995 |
| JP | 7-273509 | 10/1995 |
| JP | 8-35987 | 2/1996 |
| JP | 8-261898 | 10/1996 |
| JP | 8-330401 | 12/1996 |
| JP | 10-116866 | 5/1998 |
| JP | 10-339743 | 12/1998 |
| JP | 11-023975 | 1/1999 |
| JP | 11-031724 | 2/1999 |
| JP | 2000-329664 | 11/2000 |
| JP | 2001-124676 | 5/2001 |
| JP | 2001-189285 | 7/2001 |
| JP | 2001-189378 | 7/2001 |
| JP | 2001-358184 | 12/2001 |
| JP | 2002-033374 | 1/2002 |
| JP | 2002/164396 | 6/2002 |
| JP | 2002-203879 | 7/2002 |
| JP | 2002-243502 | 8/2002 |
| SU | 843040 | 6/1981 |
| SU | 1392603 | 4/1988 |
| WO | WO 80/00101 | 1/1980 |
| WO | WO 86/07493 | 12/1986 |
| WO | WO 89/04001 | 5/1989 |
| WO | WO 01/69656 | 9/2001 |
| WO | WO 2004/049395 | 6/2004 |
| WO | WO 2004/065944 | 8/2004 |
| WO | WO 2004/079299 | 9/2004 |
| WO | WO 2005/062025 | 7/2005 |

OTHER PUBLICATIONS

Sam Hanash, "insight review articles, Disease proteomics," Nature, vol. 422, Mar. 13, 2003, pp. 226-232.

Mike Tyers and Matthias Mann, "insight overview, From genomics to proteomics," Nature, vol. 422, Mar. 13, 2003, pp. 193-197.

Ruedi Aebersold and Matthias Mann, "insight review articles, Mass spectrometry-based proteomics," Nature, vol. 422, Mar. 13, 2003, pp. 198-207.

Barbara Marte, Senior Editor, "Nature insight Proteomics," Nature vol. 422, Mar. 13, 2003 pp. 191-194.

Francesc Purroy and Lluis Pradell, "New Theoretical Analysis of the LRRM Calibration Technique for Vector Network Analyzers," IEEE Transactions on Instrumentation and Measurement, vol. 50, No. 5, Oct. 2001, pp. 1307-1313.

Christophe Risacher, et al., "Waveguide-to-Microstrip Transition With Integrated Bias-T," IEEE Microwave and Wireless Components Letters, vol. 13, No. 7, Jul. 2003, pp. 262-264.

Deming Xu, Liping Liu, and Zhiyan Jiang, "Measurement of the Dielectric Properties of Biological Substances Using an Improved Open-Ended Coaxial Line Resonator Method," IEEE Transactions on Microwave Theory and Techniques, vol. MTT-35, No. 12, Dec. 1987, pp. 1424-1428.

Mohammed Nurul Afsar, James R. Birch, and R. N. Clarke, "The Measurement of the Properties of Materials," Proceedings of the IEEE, vol. 74, No. 1, Jan. 1986, pp. 183-199.

Andrzej W. Kraszewski, Stuart O. Nelson, and Tian-Su You, "Use of a Microwave Cavity for Sensing Dielectric Properties of Arbitrarily Shaped Biological Objects," IEEE Transactions on Microwave Theory and Techniques, vol. 338, No. 7, Jul. 1990, pp. 858-863.

Leonard Hayden, "A Multi-Line TRL Calibration," Feb. 2, 1994, 5 pages.

Christophe Seguinot, et al., "Multimode TRL—A New concept in Microwave Measurements: Theory and Experimental Verification," IEEE Transactions on Microwave Theory and Techniques, vol. 46, No. 5, May 1998, 536-542.

Robert D. Grober, Robert J. Schoelkopf, and Daniel E. Prober, "Optical antenna: towards a unity efficiency near-field optical probe," Appl. Phys. Lett. 70 (11), Mar. 17, 1997, 1997 American Institute of Physics, pp. 1354-1356.

Christophe Risacher, Vessen Vassilev, Alexey Pavolotsky, and Victor Belitsky, "Waveguide-to-Microstrip Transition With Integrated Bias-T," IEEE Microwave and Wireless Components Letters, vol. 13, No. 7, Jul. 2003, pp. 262-264.

John A. Modolo, Gordon Wood Anderson, Francis J. Kub, and Ingham A.G. Mack, "Wafer level high-frequency measurements of photodetector characteristics," Applied Optics, vol. 27, No. 15, Aug. 1, 1988, pp. 3059-3060.

Cascade Microtech, "Introducing the peak of analytical probe stations," MicroProbe Update, May 1990.

H.-J. Eul and B. Schiek, "Thru-Match-Reflect: One Result of a Rigorous Theory for De-Embedding and Network Analyzer Calibration," 18$^{th}$ Euopean Microwave Conference '88, The International Conference Designed for the Microwave Community, Published by Microwave Exhibitions and Publishers Limited, Sep. 12-16, 1988, Stockholm, Sweden.

Cascade Microtech, "Analytical Probe Station," Summit 9000 Series, Jun. 1, 1990.

Maury Microwave Corporation, "MT950D Series, Transistor Test Fixture Software, Software Application Packs," Sep. 20, 1982.

Eric Phizicky, Philippe I.H. Bastiaens, Heng Zhu, Michael Snyder, & Stanley Fields, "Protein analysis on a proteomic scale," Nature 422, insight: review article, Mar. 13, 2003.

Brian J. Clifton, "Precision slotted-Line Impedance Measurements Using computer Simulation for Data Correction," IEEE Transactions on Instrumentation and Measurement, vol. IM-19, No. 4, Nov. 1970, pp. 358-363.

Eric Strid (Cascade Microtech), "Planar Impedance Standards and Accuracy Considerations in Vector Network Analysis," Jun. 1986, 8 pages.

Maury Microwave Corporation, "MT950 Series Transistor Test Fixture (TTF) Notice! Notice! Notice!," May 31, 1985.

Maury Microwave Corporation, MT950 Series Transistor Test Fixture (TTF), Oct. 7, 1982, 4 pages.

Design Technique, "Microstrip Microwave Test Fixture," May 1986, 2 pages.

Micromanipulator Sales and Services Inc., "Test Station Accessories," Copyright 1983, 1984, 1 page.

Keithley Instruments, Inc. "Low-Level Measurements for Effective Low Current, Low Voltage, and High Impedance Measurements," Revised Third Edition, Printed Jun. 1984.

Hewlett Packard, "HP 4284A Precision LCR Meter Operation Manual (Including Option 001,002,006,201,202,301)," Third Edition, Dec. 1991, pp. 2-1, 6-9, 6-15.

Cletus A Hoer, "A High-Power Dual Six-Port Automatic Network Analyzer Used in Determining Biological Effects of RF and Microwave Radiation," IEEE Transactions on Microwave Theory and Techniques, vol. MTT-29, No. 12, Dec. 1981.

Cascade Microtech Technical Brief, A Guide to Better Vector Network Analyzer Calibrations for Probe-Tip Measurements, Copyright 1994, 2 pages.

Temptronic, "Guarded" Chuck Sketch, Nov. 15, 1989.

William Knauer, "Fixturing for Low-Current/Low-Voltage Parametric Testing," Evaluation Engineering, Nov. 1990, pp. 9-12.

J.D.Tompkins, "Evaluating High Speed AC Testers," IBM Technical Disclosure Bulletin, vol. 13, No. 7 Dec. 1970, p. 180.

Jim Fitzpatrick, "Error Models for Systems Measurement," Microwave Journal, May 1978, pp. 63-66.

Design Technique International, "Adjustable Test Fixture," Copyright 1988.

Ronald F. Bauer & Paul Penfield, Jr., "De-Embedding and Unterminating," IEEE Transactions on Microwave Theory and Techniques, vol. MTT-22, No. 3, Mar. 1974, pp. 282-288.

Cross Section—Signatone S-1240 Sketch, Advertised & Sold 1987-1988.

Yousuke Yamamoto, "A Compact Self-Shielding Prober for Accurate Measurement of On-Wafer Electron Devices," IEEE Transactions on Instrumentation and Measurement, vol. 38, No. 6, Dec. 1989, pp. 1088-1093.

R.Y. Koyama & M. G. Buehler, "Semiconductor Measurement Technology: A Wafer Chuck for Use Between−196 and 350° C.," U.S. Department of Commerce, National Technical Information Service, PB-293 298, Issued Jan. 1979.

Ken Cole, "ThermoChuck Performance (Fax)," 2 pages, Mar. 10, 1995.

S. Beck & E. Tomann, "Chip Tester," IBM Technical Disclosure Bulletin, Jan. 1985.

L. L. Sohn, O. A. Saleh, G. R. Facer, A. J. Beavis, R. S. Allan, & D. A. Notterman, "Capacitance Cytometry: Measuring biological cells one by one," PNAS vol. 97, No. 20 Sep. 26, 2000, pp. 10687-10690.

Microwave Products, Microwave Journal, Sep. 1988, 1 page.

Cascade Microtech, "Advanced On-Wafer Device Characterization Using the Summit 10500," pp. 2-20.

Hewlett Packard, "HP 4142B Modular DC source/Monitor Practical Applications—High Speed DC Characterization of Semiconductor Devices from Sub pA to 1A," Nov. 1987, pp. 1-4.

Flexion Corporation, "Cryotest Station MP-3," *Cascade Microtech, Inc.* vs. *Micromanipulator Company, Inc.*, Applebay Exhibit 576, May 13, 1998, 68 pages.

Flexion Corporation, "Cryotest Station MP-3," *Cascade Microtech, Inc.* vs. *Micromanipulator Company, Inc.*, Applebay Exhibit 578, May 13, 1998, 1 page.

*Cascade Microtech, Inc.* vs. *Micromanipulator Company, Inc.*, Applebay Exhibit 572, May 13, 1998, 2 pages.

*Cascade Microtech, Inc.* vs. *Micromanipulator Company, Inc.*, Applebay Exhibits 581A, 581B, and 581C, May 13, 1998, 3 pages.

Flexion Corporation, "AP-1 Cryotest Station," Applebay Exhibit 582, May 13, 1998, 20 pages.

Flexion Corporation, "AP-1 Cryotest Station User Manual," Applebay Exhibit 583, May 13, 1998, 187 pages.

*Cascade Microtech, Inc.* vs. *Micromanipulator Company, Inc.*, Applebay Exhibits 577A, 577B, 577C, May 13, 1998, 3 pages.

*Cascade Microtech, Inc.* vs. *Micromanipulator Company, Inc.*, Applebay Exhibit 585, May 13, 1998, 7 pages.

\* cited by examiner

PROBE STATION HAVING MULTIPLE ENCLOSURES

CROSS-REFERENCE TO RELATED APPLICATIONS

This application is a continuation of U.S. patent application Ser. No. 11/820,519, filed Jun. 20, 2007, now U.S. Pat. No. 7,436,170 which is a continuation of U.S. patent application Ser. No. 11/450,099, filed Jun. 9, 2006, now U.S. Pat. No. 7,250,752 which is a continuation of U.S. patent application Ser. No. 10/980,083, filed Nov. 3, 2004, now U.S. Pat. No. 7,190,181, which is a continuation of U.S. patent application Ser. No. 10/615,724, filed Jul. 8, 2003, now U.S. Pat. No. 6,842,024, which is a continuation of U.S. patent application Ser. No. 10/273,787, filed Oct. 17, 2002, now U.S. Pat. No. 6,639,415, which is a continuation of U.S. patent application Ser. No. 10/013,185, filed Dec. 7, 2001, now U.S. Pat. No. 6,489,789, which is a continuation of U.S. patent application Ser. No. 09/908,218, filed Jul. 17, 2001, now U.S. Pat. No. 6,362,636, which is a continuation of U.S. patent application Ser. No. 09/451,698, filed Nov. 30, 1999, now U.S. Pat. No. 6,288,557, which is a continuation of U.S. patent application Ser. No. 08/870,335, filed Jun. 6, 1997, now U.S. Pat. No. 6,002,263.

BACKGROUND OF THE INVENTION

The present invention relates to probe stations, commonly known as package or wafer probers, used manually, semiautomatically or fully automatically to test semiconductor devices. More particularly, the invention relates to such probe stations having EMI shielded enclosures for substantially enclosing the test devices, such as those probe stations shown in commonly-owned U.S. Pat. Nos. 5,266,889 and 5,457,398 which are hereby incorporated by reference.

The probe stations shown in the foregoing patents are capable of performing both low-current and high-frequency measurements within a single shielded enclosure. However, as electrical test currents decrease, or as electrical test frequencies increase, the use of merely a single EMI shielding enclosure becomes less adequate. In the most sensitive of measurements, and particularly (although not necessarily) when guarding is employed for low current measurements as described in U.S. Pat. No. 5,457,398, the choice of the shield potential is critical. Reflecting such criticality, the single shield enclosures shown in the foregoing patents have in the past been equipped with selective connectors enabling the shield potential to match that of the measurement instrumentation ground while being isolated from other connectors, or alternatively to be biased by another connector, or to be connected to AC earth ground. Usually the measurement instrumentation ground is preferred since it provides a "quiet" shield ideally having no electrical noise relative to the measurement instrument. However, if the shielding enclosure is exposed to EMI (such as electrostatic noise currents from its external environment), its ideal "quiet" condition is not achieved, resulting in unwanted spurious currents in the chuck assembly guard element and/or the supporting element for the test device. The effect of such currents is particularly harmful to the operation of the guard element, where the spurious currents result in guard potential errors causing leakage currents and resultant signal errors in the chuck element which supports the test device.

For high-frequency measurements, guarding is typically not employed. However, for the most sensitive of measurements, the "quietness" of the shield is still critical. For this reason, it is common practice to construct a fully shielded room, commonly known as a screen room, large enough to contain a probe station with its own separate shield enclosure, test equipment, and several operators. However, screen rooms take up a large amount of space, are expensive to build, and are ineffective with respect to noise sources within the room.

The environmental influences which ordinarily compromise the desired quiet condition of a shield are the motion of external objects at constant potential which cause spurious shield currents due to varying capacitance, and external AC voltages which cause spurious shield currents via constant capacitance. For sensitive measurements, what is needed is a truly quiet shield unaffected by such environmental influences.

Also, to reduce the need for a screen room, and provide a shield unaffected by closely adjacent environmental influences, such quiet shield structure should be compact.

BRIEF SUMMARY OF THE INVENTION

The present invention satisfies the foregoing need by providing a probe station having respective inner and outer conductive shield enclosures insulated from each other, both enclosures at least partially enclosing the chuck assembly element which supports the test device, and also its associated guard element if one is provided. The outer shield enclosure, which is preferably connected either directly or indirectly to AC earth ground, intercepts the external environmental noise, minimizing its effects on the inner shield and on the chuck assembly elements enclosed by the inner shield.

Such inner and outer shield enclosures are preferably built integrally into the probe station and therefore are compact.

The foregoing and other objectives, features, and advantages of the invention will be more readily understood upon consideration of the following detailed description, taken in conjunction with the accompanying drawings.

DETAILED DESCRIPTION OF PREFERRED EMBODIMENT

Figure 1:
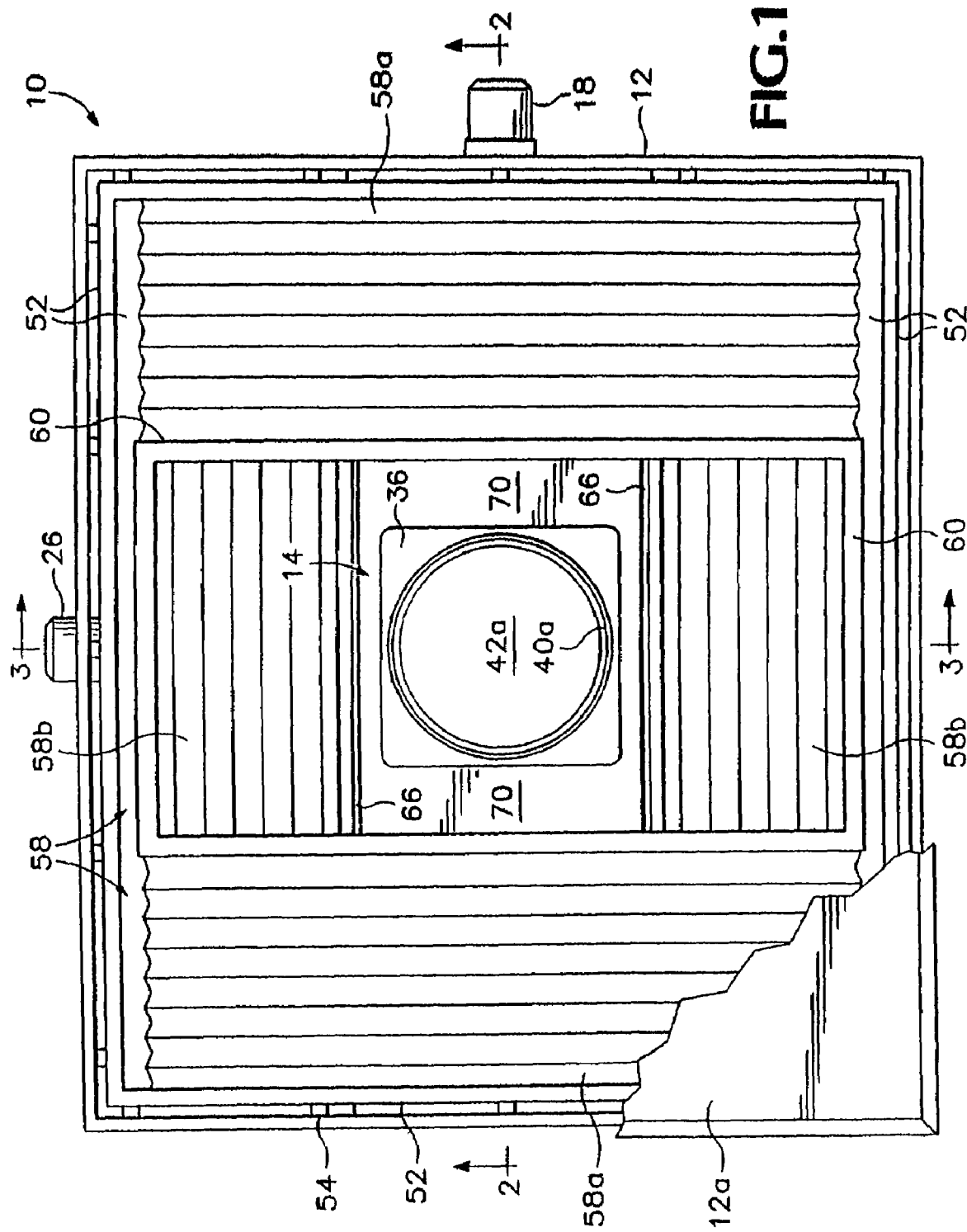
FIG. 1 is a top view of an exemplary probe station in accordance with the present invention, with the top of the station partially removed to show interior structure.

An exemplary embodiment of a probe station in accordance with the present invention, indicated generally as 10 in the figures, has an electrically conductive outer enclosure 12 including a conductive raisable hinged lid 12a electrically connected thereto. A chuck assembly 14 for supporting a test device is laterally positionable by a chuck positioner assembly having orthogonally arranged lateral X-axis and Y-axis positioners. A lateral X-axis positioner 16 has a laterally extending positioning screw (not shown) driven by an electric motor 18. The X-axis positioner 16 is partially enclosed by a conductive housing 16a, and optionally also by flexible pleated rubber boots 16b for accommodating positioning movements while preventing the entry and escape of dirt particles. The conductive housing 16a is insulated from the outer enclosure 12 by respective dielectric anodized coatings on both the exterior of the housing 16a and the interior of the enclosure 12, and is indirectly connected electrically to AC earth ground by means of conventional motor cabling and a grounded motor power supply (not shown), represented schematically in FIG. 2 by a high-impedance electrical path 22. The X-axis positioner 16 selectively moves a Y-axis positioner 24, oriented perpendicularly to the X-axis positioner 16, along the X-axis.

Figure 3:
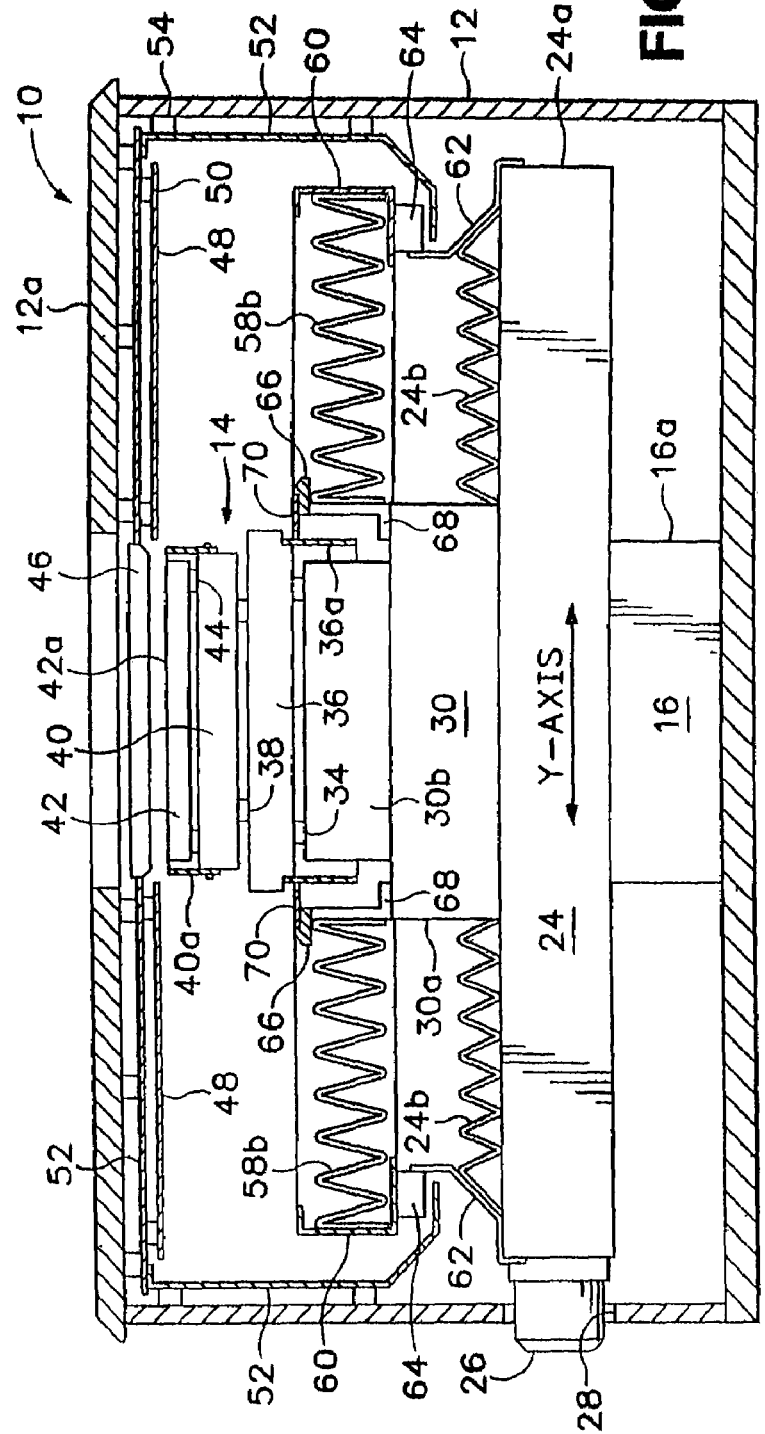
FIG. 3 is a partially sectional, partially schematic view taken along line 3-3 of FIG. 1.

The lateral Y-axis positioner 24 is constructed similarly to the X-axis positioner 16, and includes an outer conductive housing 24a with optional flexible pleated rubber boots 24b. The conductive housing 24a is electrically connected to the housing 16a of the X-axis positioner. The motor 26 of the Y-axis positioner 24 extends through a horizontal slot 28 (FIG. 3) in the side of the enclosure 12, thereby permitting it to be moved freely along the X-axis by the X-axis positioner 16. Alternatively, a larger enclosure 12 could eliminate the slot 28.

A conventional Z-axis positioner 30, having a conductive housing 30a electrically connected to the housing 24a, is movable along the Y-axis by the Y-axis positioner 24. The Z-axis positioner 30 includes respective internal electric motors (not shown) which selectively reciprocate a plunger assembly 30b vertically and rotate it through a limited range about a vertical axis in a known manner.

The outer conductive enclosure 12 is connected by a low-impedance path 32 (FIG. 2) directly to AC ground. Collectively, the outer enclosure 12, 12a and the positioner housings 16a, 24a, and 30a cooperate to provide an electrically conductive outer shield enclosure which separates the remainder of the probe station from environmental noise sources, whether located externally of the enclosure 12 or internally thereof inside the positioner housings. Such noise sources include the electric motors 18 and 26, and those motors within the Z-axis positioner 30, as well as other electrical components such as cables, thermal heaters, encoders, switches, sensors, etc.

Mounted atop the plunger assembly 30b and electrically insulated therefrom by dielectric spacers 34 is a square-shaped conductive chuck shield 36 having a downwardly depending conductive cylindrical skirt 36a. Mounted atop the chuck shield 36 and electrically insulated therefrom by dielectric spacers 38 is a conductive chuck guard element 40, which includes a peripheral cylindrical conductive guard skirt 40a. The guard skirt 40a peripherally surrounds a conductive chuck element 42 in spaced relation thereto. The chuck element 42 is insulated from the guard element 40 and guard skirt 40a by dielectric spacers 44 and has a supporting surface 42a thereon for supporting a test device during probing. Probes (not shown) are mounted on a probe ring 46, or other suitable type of probe holder, for contacting the test device when the Z-axis positioner 30 raises the supporting surface 42a upwardly into probing position.

Figure 2:
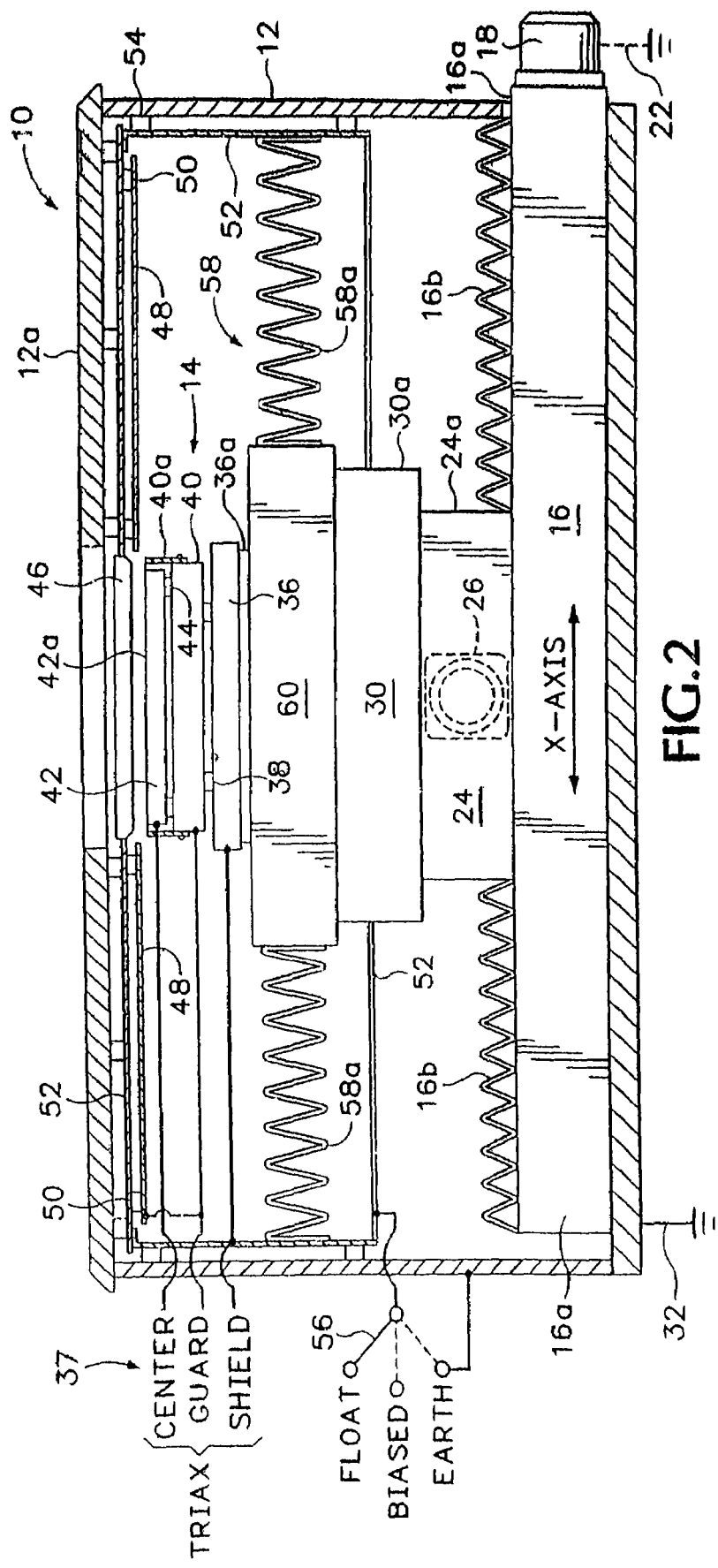
FIG. 2 is a partially sectional, partially schematic view taken along line 2-2 of FIG. 1.

As shown schematically in FIG. 2, the chuck shield 36 is electrically connected to the shield of a triaxial cable 37 interconnected with the measurement instrumentation. The guard element 40, together with the guard skirt 40a, is connected to the guard conductor of the triaxial cable, and the chuck element 42 is connected to the center or signal conductor of the triaxial cable 37. Preferably a further guard element in the form of a conductive plate 48, also electrically connected to the guard conductor of the triaxial cable and insulated from the remainder of the probe station by dielectric spacers 50, is suspended in opposed relationship to the supporting surface 42a. The conductive plate 48 also provides a connection to a guard element on the bottom of a probe card (not shown). Further details of the electrical connections, and of the dielectric spacers utilized to insulate the chuck elements from each other, are explained in U.S. Pat. No. 5,457,398 which is incorporated herein by reference. As explained in such patent, the connections to the chuck elements 40 and 42 cause such elements to have substantially equal potentials to minimize leakage currents therebetween.

An electrically conductive inner shield enclosure 52, which also preferably acts as the probe station's environment control enclosure not only for purposes of EMI shielding but also for purposes of maintaining a dry and/or dark environment, is mounted by dielectric spacers 54 to the interior of the outer enclosure 12 so as to be interposed between and insulated from the outer enclosure 12 and the chuck elements 40 and 42. Like the chuck shield 36, the enclosure 52 is connected to the shield of the triaxial cable 37 associated with the measurement instrumentation. A selective connector mechanism, schematically illustrated as a three-way switch 56 in FIG. 2, enables respective different potentials to be selectively established on the enclosure 52. Normally the selective mechanism 56 would be in the "float" position whereby the potential of the enclosure 52 depends on the triaxial shield associated with the measurement instrumentation. However the enclosure 52 can alternatively be electrically biased by the selective connector mechanism 56, or interconnected with the outer enclosure 12 if desired for particular applications. In the normal situation where the inner enclosure 52 is not electrically connected to the outer enclosure 12, the outer shield components 12, 12a, 16a, 24a, and 30a protect the inner shield 52 from external noise sources, so that the inner shield in turn can minimize noise-induced spurious currents affecting the chuck elements 40 and/or 42 and thereby maximize the accuracy of the test measurements.

Movement of the chuck assembly 14 laterally by the X-axis and Y-axis positioners 16 and 24, respectively, is accomplished with the Z-axis positioner retracted in order to position the test device with respect to the probe or probes. During such movement, the environmental integrity of the inner enclosure 52 is maintained by means of an electrically conductive flexible wall assembly indicated generally as 58. The wall assembly 58 includes a pair of flexibly extensible and retractable pleated wall elements 58a which are extensible and retractable along the X-axis, and a further pair of such wall elements 58b which are flexibly extensible and retractable along the Y-axis. The outermost ends of the wall elements 58a are electrically connected to the inner surfaces of the inner enclosure 52 by screws (not shown). The innermost ends of the wall elements 58a are similarly connected to a rectangular metal frame 60 supported by the Y-axis positioner housing 24a by means of brackets 62 (FIG. 3) and dielectric spacers 64 which insulate the frame 60 from the Y-axis positioner housing 24a. The outermost ends of the flexible wall elements 58b, on the other hand, are electrically connected to the inner surfaces of the ends of the frame 60 by screws (not shown), while their innermost ends are similarly connected to respective conductive bars 66 insulatively supported by dielectric brackets 68 atop the Z-axis positioner housing 30a. Conductive plates 70 are electrically connected to the bars 66 and surround the chuck shield skirt 36a in spaced relation thereto.

As the X-axis positioner 16 moves the Y-axis positioner 24 and chuck assembly along the X-axis, it likewise moves the frame 60 and its enclosed wall elements 58b along the X-axis as the wall elements 58a extend and retract. Conversely, as the Y-axis positioner 24 moves the Z-axis positioner and chuck assembly along the Y-axis, the wall elements 58b similarly extend and retract along the Y-axis.

Figure 4:
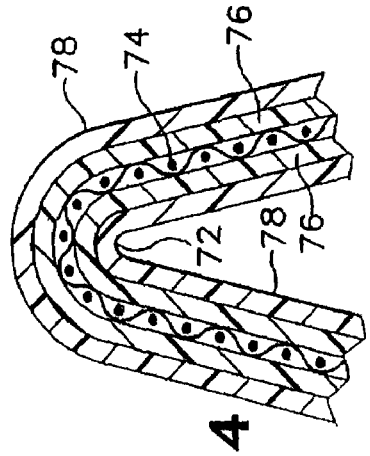
FIG. 4 is an enlarged sectional view of a portion of a flexible wall element of the embodiment of FIG. 1.

With reference to FIG. 4, a cross-section of an exemplary pleat 72 of the flexible wall elements 58a and 58b is shown. The electrically conductive core 74 of the pleated material is a fine mesh polyester, chemically coated with copper and nickel. The core 74 is sandwiched between respective layers 76 which are nylon fabric with a PVC stiffener. The respective layers 76 in turn are covered by respective outer layers 78 of polyurethane. The pleated material is preferably fluid-impervious and opaque so that the inner enclosure 52 can serve as a dry and/or dark environment control chamber, as well as an EMI shield. However, if the inner enclosure 52 were merely intended to serve as a shield, the pleated material need not be fluid-impervious or opaque. Conversely, if the inner enclosure 52 were intended to serve merely as an environment control chamber for dry and/or dark purposes, without EMI shielding, the pleated material's conductive core 74 could be eliminated. Also, alternative pleated materials of other compositions, such as thin, highly flexible stainless steel or other all-metal sheet material, could be used.

Figure 5:
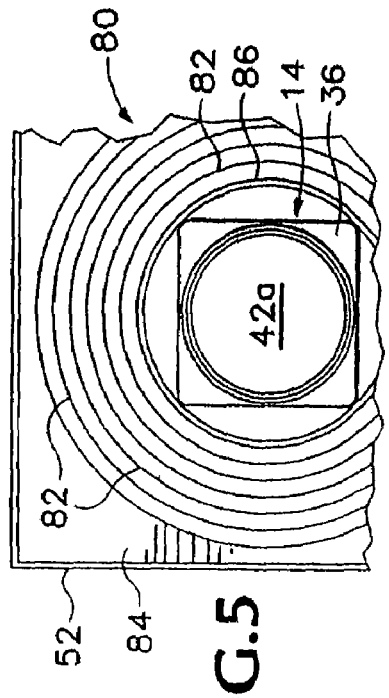
FIG. 5 is a partial top view of an alternative embodiment of the invention.

As a further alternative, a one-piece flexible wall assembly 80 (FIG. 5) having circular or oblate curved rings of pleats 82 surrounding the chuck assembly 14 could be provided in place of the wall assembly 58 to permit flexible extension and retraction in radial X and Y directions. The outer extremity of the wall assembly 80 is electrically connected by a curved conductive frame 84 to the inner shield enclosure 52. The inner extremity of the wall assembly 80 is supported by a circular conductive ring 86, and an underlying circular dielectric bracket (not shown) comparable to bracket 68, upon the Z-axis positioner housing 30*a*.

As a further alternative, the inner enclosure 52 could utilize conductive or nonconductive sliding plates, such as those shown in U.S. Pat. No. 5,457,398 incorporated herein by reference, in place of the flexible wall assembly 58 if the more desirable characteristics of the flexible wall assembly are not needed. As a still further alternative, unpleated flexibly extensible and retractable material could be used instead of pleated material in the wall assembly 58.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

We claim:

1. A probe station for probing a test device, said probe station comprising:
   (a) a chuck suitable for supporting said test device during probing thereof;
   (b) an electrically conductive first enclosure at least partially enclosing said chuck and insulated therefrom;
   (c) an electrically conductive second enclosure interposed between and insulated from said first enclosure and said chuck, and at least partially enclosing said chuck;
   (d) respective electrical connections connected electrically to said chuck and said second enclosure, respectively, causing said second enclosure and said chuck to have respective potentials independent of each other;
   (e) said second enclosure having a first portion substantially fixedly mounted with respect to said first enclosure and a second portion movably mounted with respect to said first enclosure, said chuck and said second portion being interconnected so as to move in unison with respect to said first portion.

2. The probe station of claim 1 including a selective connector mechanism enabling respective different potentials to be selectively established on said second enclosure.

3. The probe station of claim 1 wherein a supporting surface of said chuck extends laterally, and said chuck is selectively movable laterally with respect to said first enclosure and said first portion of said second enclosure, said second portion of said second enclosure having conductive material interconnecting said chuck with said first portion of said second enclosure and movable laterally with respect to said first portion in response to lateral movement of said chuck.

4. The probe station of claim 3 wherein said conductive material is flexible.

5. The probe station of claim 4 wherein said conductive material is pleated.

6. The probe station of claim 1 wherein said first enclosure supports said first portion of said second enclosure in an insulated substantially fixed spaced relationship thereto.

7. The probe station of claim 1 wherein said second enclosure and said chuck are both guard potential.

8. probe station for probing a test device, said probe station comprising:
   (a) a chuck having respective first and second elements electrically insulated from each other, the first element including a supporting surface for supporting said test device during probing thereof, and the second element having conductive material in spaced relationship to said supporting surface;
   (b) an electrically conductive first enclosure at least partially enclosing said first and second elements and insulated therefrom;
   (c) respective electrical connections connected to said first and second elements causing said first and second elements to have substantially equal potentials;
   (d) an electrically conductive second enclosure interposed between and insulated from said first enclosure and said first and second elements, and at least partially enclosing said first and second elements;
   (e) a further electrical connections connected electrically to said second enclosure causing said second enclosure to have a potential different from the potentials of said first and second elements, said further electrical connections not being electrically connected to said first enclosure.

9. The probe station of claim 8 including a selective connector mechanism enabling respective different potentials to be selectively established on said second enclosure.

10. The probe station of claim 8, further including an electrically conductive member opposing said supporting surface and in spaced relationship thereto, said conductive member being electrically connected to said second element, said second enclosure being interposed between said first enclosure and said conductive member and insulated from said conductive member.

11. The probe station of claim 8 wherein said supporting surface extends laterally, and said chuck is selectively movable laterally with respect to said first enclosure and a portion of said second enclosure, said second enclosure having conductive material interconnecting said chuck with said portion of said second enclosure and movable laterally with respect to said portion in response to lateral movement of said chuck.

12. The probe station of claim 11 wherein said conductive material is flexible.

13. The probe station of claim 12 wherein said conductive material is pleated.

14. The probe station of claim 8 wherein said first enclosure supports a portion of said second enclosure in an insulated substantially fixed spaced relationship thereto.

15. The probe station of claim 8 wherein said second enclosure and said chuck are both guard potential.

* * * * *